US008988822B2

(12) United States Patent
Zhang et al.

(10) Patent No.: US 8,988,822 B2
(45) Date of Patent: *Mar. 24, 2015

(54) COFE/NI MULTILAYER FILM WITH PERPENDICULAR ANISOTROPY FOR MICROWAVE ASSISTED MAGNETIC RECORDING

(71) Applicant: Headway Technologies, Inc., Milpitas, CA (US)

(72) Inventors: Kunliang Zhang, Fremont, CA (US); Min Li, Fremont, CA (US); Yuchen Zhou, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/645,947

(22) Filed: Oct. 5, 2012

(65) Prior Publication Data

US 2013/0029182 A1 Jan. 31, 2013

Related U.S. Application Data

(62) Division of application No. 12/800,196, filed on May 11, 2010, now Pat. No. 8,300,356.

(51) Int. Cl.
*G11B 5/235* (2006.01)
*G11B 5/31* (2006.01)
(Continued)

(52) U.S. Cl.
CPC .............. *G11B 5/1278* (2013.01); *B82Y 10/00* (2013.01); *B82Y 25/00* (2013.01); *G01R 33/093* (2013.01);
(Continued)

(58) Field of Classification Search
CPC .. G11B 5/1278; G11B 5/3153; G11B 5/3909; G11B 5/3967; G11B 2005/0024; G11B 2005/3996; G11B 5/235

USPC ......... 360/324, 324.1, 324.11, 324.12, 324.2, 360/119.02, 119.03, 119.04, 125.3
See application file for complete search history.

(56) References Cited

U.S. PATENT DOCUMENTS 6,815,082 B2   11/2004   Girt
8,064,244 B2   11/2011   Zhang et al.
(Continued)

OTHER PUBLICATIONS

"Current-driven excitation of magnetic multilayers," by J.C. Slonczewski, Journal of Magnetism and Magnetic Materials 159, Jun. 1996, L1-L7, Elsevier.
(Continued)

*Primary Examiner* — Craig A. Renner
(74) *Attorney, Agent, or Firm* — Saile Ackerman LLC; Stephen B. Ackerman

(57) ABSTRACT

A spin transfer oscillator with a seed/SIL/spacer/FGL/capping configuration is disclosed with a composite seed layer made of Ta and a metal layer having a fcc(111) or hcp(001) texture to enhance perpendicular magnetic anisotropy (PMA) in an overlying $(A1/A2)_X$ laminated spin injection layer (SIL). Field generation layer (FGL) is made of a high Bs material such FeCo. Alternatively, the STO has a seed/FGL/spacer/SIL/capping configuration. The SIL may include a FeCo layer that is exchanged coupled with the $(A1/A2)_X$ laminate (x is 5 to 50) to improve robustness. The FGL may include an $(A1/A2)_Y$ laminate (y=5 to 30) exchange coupled with the high Bs layer to enable easier oscillations. A1 may be one of Co, CoFe, or CoFeR where R is a metal, and A2 is one of Ni, NiCo, or NiFe. The STO may be formed between a main pole and trailing shield in a write head.

4 Claims, 6 Drawing Sheets

(51) Int. Cl.

| | |
|---|---|
| G11B 5/39 | (2006.01) |
| G11B 5/127 | (2006.01) |
| B82Y 10/00 | (2011.01) |
| B82Y 25/00 | (2011.01) |
| G01R 33/09 | (2006.01) |
| G01R 33/12 | (2006.01) |
| H01F 10/32 | (2006.01) |
| H01F 41/30 | (2006.01) |
| H01L 43/08 | (2006.01) |
| H01L 43/10 | (2006.01) |
| H01L 43/12 | (2006.01) |
| B82Y 40/00 | (2011.01) |
| G11B 5/00 | (2006.01) |

(52) U.S. Cl.
CPC .......... *G01R 33/1284* (2013.01); *G11B 5/3153* (2013.01); *G11B 5/3909* (2013.01); *H01F 10/3286* (2013.01); *H01F 41/305* (2013.01); *H01F 10/329* (2013.01); *H01L 43/08* (2013.01); *H01L 43/10* (2013.01); *H01L 43/12* (2013.01); *B82Y 40/00* (2013.01); *G11B 5/3967* (2013.01); *G11B 2005/0024* (2013.01); *G11B 2005/3996* (2013.01); *H01F 10/325* (2013.01); *H01F 10/3254* (2013.01)
USPC .................. 360/119.03; 360/125.3; 360/324.2

(56) References Cited

U.S. PATENT DOCUMENTS

| | | | |
|---|---|---|---|
| 8,184,411 | B2 | 5/2012 | Zhang et al. |
| 2007/0070556 | A1 | 3/2007 | Zhang et al. |
| 2009/0257151 | A1 | 10/2009 | Zhang et al. |
| 2009/0269617 | A1 | 10/2009 | Zhang et al. |
| 2010/0073827 | A1 | 3/2010 | Zhao et al. |
| 2011/0096443 | A1* | 4/2011 | Zhang et al. ............... 360/324.2 |
| 2011/0216447 | A1* | 9/2011 | Li et al. ..................... 360/313 |

OTHER PUBLICATIONS

"Microwave Assisted Magnetic Recording," by Jian-Gang Zhu et al., IEEE Transactions on Magnetics, vol. 44, No. 1, Jan. 2008, pp. 125-131.

"Prediction and Confirmation of Perpendicular Magnetic Anisotropy in Co/Ni Multilayers," by G. H. O. Daalderop et al., vol. 68, No. 5, Physical Review Letters, Feb. 3, 1992, pp. 682-685.

"Co/Ni multilayrs with perpendicular magnetic anisotropy: Kere effect and thermomagnetic writing," by F. J. A. Den Broeder et al., Appl. Phys. Lett. 61 (12), Sep. 21, 1992, 1992 American Institute of Physics, pp. 1468-1470.

"Effect of [111] texture on the perpendicular magnetic anistoropy of Co/Ni multilayers," by V. M. Naik et al., Journal of Applied Physics, vol. 84, No. 6, Sep. 15, 1998, pp. 3273-3277, 1998 American Institute of Physics.

"Magnetic and magneto-optic properties of sputtered Co/Ni multilayers," by Y. B. Zhang et al., J. Appl. Phys. 75 (10), May 15, 1994, pp. 6495-6497, 1994 American Institute of Physics.

"Perpendicular magnetic anisotropy of the epitaxial fcc Co/60-Å-Ni/Cu(001) system," by Jaeyong Lee et al., Physical Review B, vol. 56, No. 10, Sep. 1, 1997—II, pp. R5728-R5731, 1997 The American Physical Society.

"Magnetic anisotropies in Co/Ni(111) multilayers," by P. J. H. Bloemen et al., J. Appl. Phys. 72 (10), Nov. 15, 1992, pp. 4840-4844, 1992 American Institute of Physics.

"Spin-torque driven ferromagnetic resonance of Co/Ni synthetic layers in spin valves," by W. Chen et al., Applied Physics Letters 92, 12507, pp. 1-3, Jan. 2008, 2008 American Institute of Physics.

Japanese Office Action, Japanese Patent App. No. 2011-106429, Mailed: Feb. 25, 2014, Headway Technologies Inc.

* cited by examiner

COFE/NI MULTILAYER FILM WITH PERPENDICULAR ANISOTROPY FOR MICROWAVE ASSISTED MAGNETIC RECORDING

This is a Divisional application of U.S. patent application Ser. No. 12/800,196, filed on May 11, 2010, which is herein incorporated by reference in its entirety, and assigned to a common assignee.

RELATED PATENTS

This application is related to U.S. Pat. No. 8,064,244 and U.S. Pat. No. 8,184,411; assigned to the same assignee and herein incorporated by reference in their entirety.

FIELD OF THE INVENTION

The invention relates to a high performance spin valve in which (CoFe/Ni)n multilayer structures having high perpendicular magnetic anisotropy (PMA) are used to establish partial PMA in high moment materials such as FeCo through exchange coupling thereby enabling easier flux generation layer (FGL) oscillations in microwave assisted magnetic recording (MAMR).

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Both MRAM and STT-MRAM have a MTJ element based on a tunneling magneto-resistance (TMR) effect wherein a stack of layers has a configuration in which two ferromagnetic layers are separated by a thin non-magnetic dielectric layer, or based on a GMR effect where a reference layer and free layer are separated by a metal spacer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned or reference layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers (CPP mode), a lower resistance is detected when the magnetization directions of the free and pinned layers are in a parallel state ("1" memory state) and a higher resistance is noted when they are in an anti-parallel state or "0" memory state.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM and a conventional MRAM is only in the write operation mechanism. The read mechanism is the same.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement but also have no limit of cell aspect ratio. As a result, spin valve structures based on PMA are capable of scaling for higher packing density which is a key challenge for future MRAM applications and other spintronic devices.

Materials exhibiting PMA such as CoPt, CoPt—$SiO_2$, Tb(Fe)Co, and FePt have been reported multiple times in publications. However, all of the literature examples suffer from at least one drawback. It is preferred that establishing a PMA property in a spin valve structure does not require strenuous heating. Unfortunately, FePt or Tb(Fe)Co need high temperature annealing to achieve high enough PMA which is unacceptable for device integration since certain components are damaged by high temperatures. CoPt and its alloys such as CoCrPt and CoPt—$SiO_2$ are not desirable because Pt and Cr are severe spin depolarizing materials and will seriously quench the amplitude of spintronic devices if incorporated in the spinvalve structures. That leaves the novel magnetic multilayer systems such as Co/X where X=Pt, Pd, Au, Ni, Ir, and the like for consideration. As stated above, Co/Pt, Co/Pd, and Co/Ir will not be good PMA materials for spintronic devices because of the severe spin depolarizing property of Pt, Pd, and Ir. Furthermore, Co/Pt, Co/Pd, and Co/Ir configurations typically require a very thick and expensive Pt, Pd, or Ir as a seed layer. Au is associated with high cost and easy interdiffusion to adjacent layers which makes a Co/Au multilayer for PMA purposes less practical. On the other hand, a Co/Ni multilayer configuration as a PMA material candidate has several advantages including (a) much higher spin polarization from Co, Ni, and Co/Ni interfaces, (b) better stability from the robustness of Ni layer insertion, (c) much higher saturation magnetization of 1 Tesla or about 2× higher than other Co/M combinations (M=metal), and (d) low cost.

PMA materials have been considered for MAMR applications as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1 is taken from the aforementioned reference and shows an ac field assisted perpendicular head design. The upper caption 19 represents a perpendicular spin torque driven oscillator for generating a localized ac field in a microwave frequency regime and includes a bottom electrode 11a, top electrode 11b, perpendicular magnetized reference layer 12 (spin injection layer or SIL), metallic spacer 13, and oscillating stack 14. Oscillator stack 14 is made of a field generation layer (FGL) 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchanged coupled. Improved materials for the reference layer and oscillator stack are needed as this technology matures.

Several attempts disclosed in the literature have been made in order to achieve high PMA from Co/Ni multilayer configurations. However, all of the examples typically involve a very thick underlayer to establish PMA. For instance, G. Daalderop et al. in "Prediction and Confirmation of Perpendicular Magnetic Anisotropy in Co/Ni Multilayers", Phys. Rev. Lett. 68, 682 (1992) and F. den Broeder et al. in "Co/Ni multilayers with perpendicular magnetic anisotropy: Kerr effect and thermomagnetic writing", Appl. Phys. Lett. 61, 1648 (1992), use a 2000 Angstrom thick Au seed layer. In V. Naik et al., "Effect of (111) texture on the perpendicular magnetic anisotropy of Co/Ni multilayers", J. Appl. Phys. 84, 3273 (1998), and in Y. Zhang et al., "Magnetic and magneto-optic properties of sputtered Co/Ni multilayers", J. Appl. Phys. 75, 6495 (1994), a 500 Angstrom Au/500 Angstrom Ag composite seed layer is employed. Jaeyong Lee et al. in "Perpendicular magnetic anisotropy of the epitaxial fcc Co/60-Angstrom-Ni/Cu(001) system", Phys. Rev. B 57, RS728 (1997) describe a 1000 Angstrom thick Cu seed layer. A 500 Angstrom Ti or 500 Angstrom Cu seed layer with heating to 150° C. is used by P. Bloemen et al. in "Magnetic anisotropies in Co/Ni (111) multilayers", J. Appl. Phys. 72, 4840 (1992). W. Chen et al. in "Spin-torque driven ferromagnetic resonance of Co/Ni synthetic layers in spin valves", Appl. Phys. Lett. 92, 012507 (2008) describe a 1000 Angstrom Cu/200 Angstrom Pt/100 Angstrom Cu composite seed layer. The aforementioned seed layers are not practical with Co/Ni multilayer PMA configurations in spintronic devices. Typically, there is a space restriction in a direction perpendicular to the planes of the spin valve layers in advanced devices in order to optimize performance. Seed layers thicker than about 100 Angstroms will require thinning a different layer in the spin valve to maintain a certain minimum thickness for the spin valve which can easily lead to performance degradation.

In particular, it is highly desirable to design a system whereby a thin seed layer helps to establish PMA in overlying layers, and materials exhibiting high PMA may be used to induce partial PMA in magnetic layers with high moments to enable easier FGL oscillation within the high moment materials and therefore generate a larger oscillating field (Hac) for better MAMR performance.

SUMMARY OF THE INVENTION

One objective of the present invention is to improve the robustness of a spin injection layer (SIL) in a MAMR device.

A second objective of the present invention is to enable an easier FGL oscillation in a MAMR device and thereby produce a larger oscillating field (Hac).

According to one embodiment of the present invention, these objectives are achieved in a bottom SIL structure wherein a stack of layers comprised of a composite seed layer, $[CoFe(t1)/Ni(t2)]_X$-laminated reference (SIL) layer where x is from about 5 to 50 and Fe content ranges from 0 to 90 atomic %, a non-magnetic spacer, a FeCo FLG, and a capping layer are sequentially formed on a substrate. The seed layer preferably has a Ta/M1/M2 or Ta/M1 configuration where M1 is an alloy such as NiCr or a metal having a fcc(111) or (hcp) hexagonal closed packed (001) crystal orientation such as Ru, and M2 is Cu, Ti, Pd, W, Rh, Au, or Ag. In the case of Pd, Au, and Ag, the M2 layer thickness is kept to a minimum in order to reduce cost and/or minimize any spin depolarization effect. The Ta and M1 layers in the composite seed layer are critical for enhancing the (111) texture in overlying layers. In the SIL, each of the CoFe layers has a thickness (t1) from 0.5 to 5 Angstroms and each of the Ni layers has a thickness (t2) of 2 to 10 Angstroms. The spacer may be Cu in a CPP-GMR configuration or one of AlOx, MgO, TiOx, TiAlOx, MgZnOx, ZnOx, or other metal oxides or nitrides typically employed as insulator layers to provide a CPP-TMR configuration. The capping layer may be Ru/Ta/Ru, for example.

In another aspect, the bottom SIL structure may be further comprised of a $[CoFe(t1)/Ni(t2)]_Y$ laminate that is exchange coupled with the FeCo layer to give a $[CoFe(t1)/Ni(t2)]_Y/$FeCo FGL configuration where y is between 5 and 30. Furthermore, one or both of the CoFe/Ni laminates in the seed/SIL/spacer/FGL/capping layer configuration may be replaced by a $[Co(t1)/NiFe(t2)]$, $[Co(t1)/NiCo(t2)]$, $[CoFe(t1)/NiFe(t2)]$, $[CoFe(t1)/NiCo(t2)]$, $[CoFeR(t1)/NiFe(t2)]$, or $[CoFeR(t1)/NiCo(t2)]$ laminate where R is one of Ru, Rh, Pd, Ti, Zr, Hf, Ni, Cr, Mg, Mn, or Cu. Alternatively, the FeCo FGL layer where Fe content is ≥50 atomic % may be replaced by a CoFe alloy in which Fe content is <50 atomic %.

The present invention also encompasses a top SIL embodiment in which a spin valve comprises a composite seed layer, FeCo FGL, non-magnetic spacer, a laminated $[CoFe(t1)/Ni(t2)]_X$ SIL, and a capping layer sequentially formed on a substrate. The aforementioned layers have the same composition as mentioned in the bottom SIL embodiments. Alternatively, the FGL may be further comprised of a laminated $[CoFe(t1)/Ni(t2)]_Y$ layer to give a $[CoFe(t1)/Ni(t2)]_Y/$FeCo FGL configuration. Moreover, the FeCo layer where the Fe content is ≥50 atomic % in the preferred top SIL embodiments may be replaced by a CoFe alloy in which Fe content is <50 atomic %.

In still another embodiment, the spin valve structure may be represented by seed layer/$[CoFe(t1)/Ni(t2)]_X$/FeCo/spacer/$[CoFe(t1)/Ni(t2)]_Y$/FeCo/capping layer in a seed/SIL/FeCo/spacer/FGL/FeCo/capping layer configuration. This structure provides the maximum benefit of exchange coupling between a laminated layer with high PMA and a high moment material such as FeCo since easier oscillation is enabled in the FGL simultaneously with improving the robustness of the SIL. Preferably, the FeCo layer that is exchange coupled with the SIL has a thickness less than the SIL and the FeCo layer exchange coupled with the FGL has a thickness between 100 and 300 Angstroms.

In another aspect, the Cu spacer in the aforementioned CPP-GMR configurations may be modified by inserting a confining current path (CCP) nano-oxide layer (NOL) between upper and lower portions of the Cu spacer. For example, an amorphous oxide such as AlOx with thin metal paths therein may be formed between two copper spacer layers in a Cu/AlOx/Cu configuration. In a CCP-CPP scheme, the Cu metal path is limited through an insulator template so that the MR ratio in the spin valve can be enhanced quite significantly.

In all embodiments, the substrate may be a main pole layer and a write shield may be formed on the capping layer. The spin valve stack may be annealed between 150° C. and 300° C. for a period of 0.5 to 5 hours. Preferably, the FeCo and Ni layers in the $(CoFe/Ni)_X$ laminate are deposited with a very low RF power and a high inert gas pressure to minimize the impinging ion energy so that deposition of a layer does not damage the CoFe or Ni layer on which it is formed. Thus, the interfaces between adjoining CoFe and Ni layers are preserved to maximize the PMA property. Furthermore, this method enables the PMA of $(CoFe/Ni)_X$ and $(CoFe/Ni)_Y$ laminates to be preserved with a substantially thinner seed layer.

DETAILED DESCRIPTION OF THE INVENTION

Figure 1:
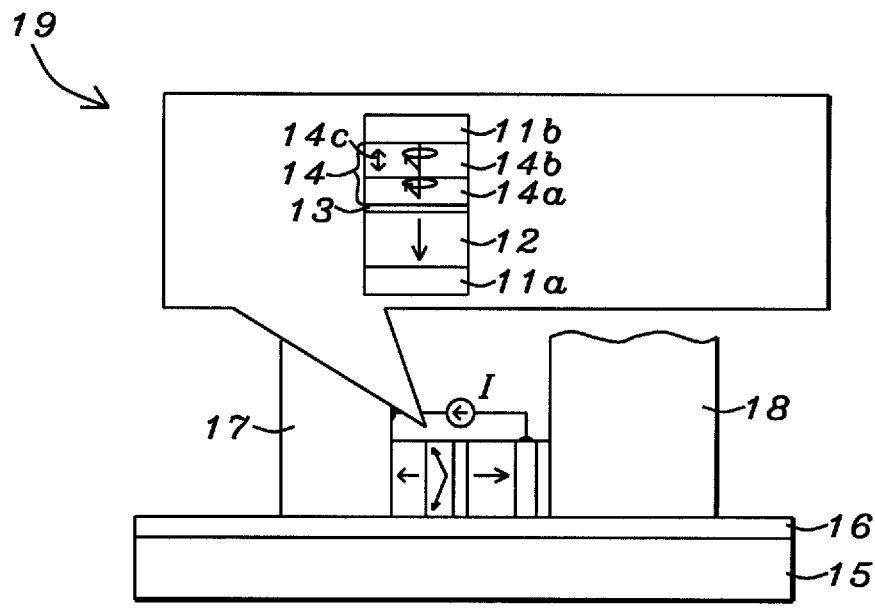
FIG. 1 is a schematic illustration of a MAMR recording head with an ac field assisted perpendicular head design according to a prior art reference.
Figure 2:
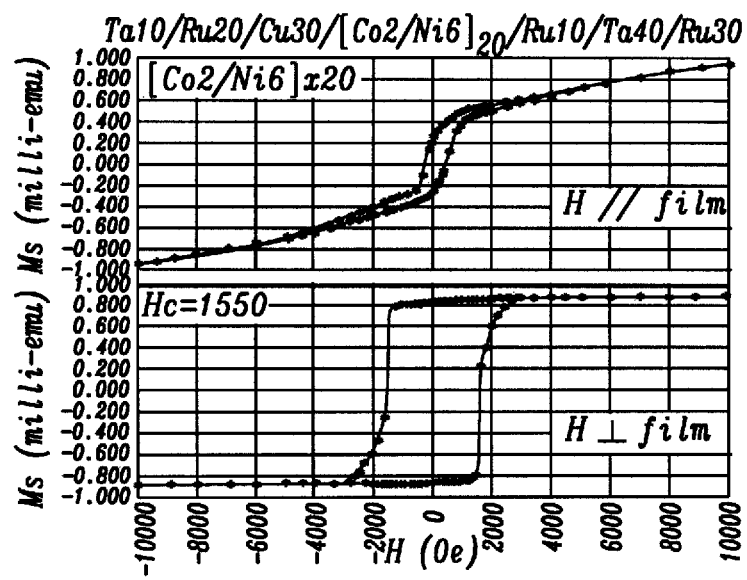
FIG. 2 shows MH curves for a SIL comprised of a $(Co2/Ni6)_{20}$ laminate.
Figure 3:
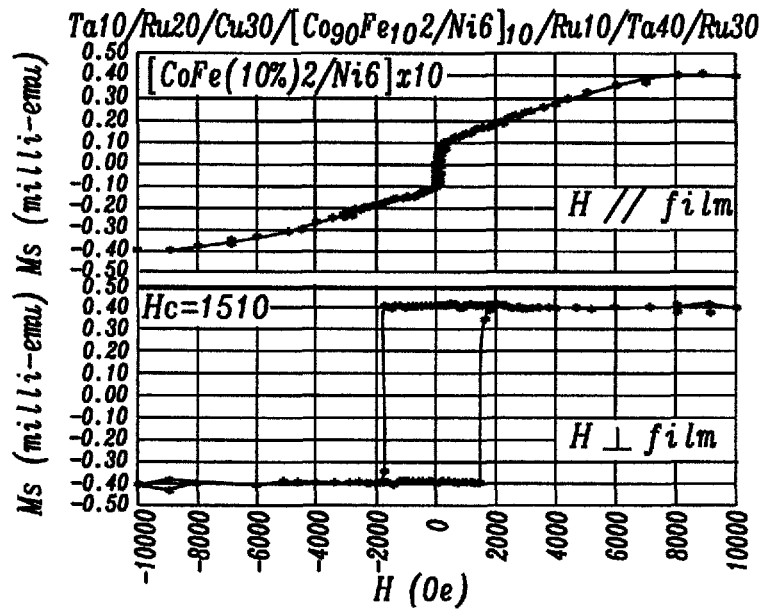
FIG. 3 depicts MH curves for a $(Co_{90}Fe_{10}2/Ni6)_{10}$ laminated SIL with PMA according to an embodiment of the present invention.
Figure 4:
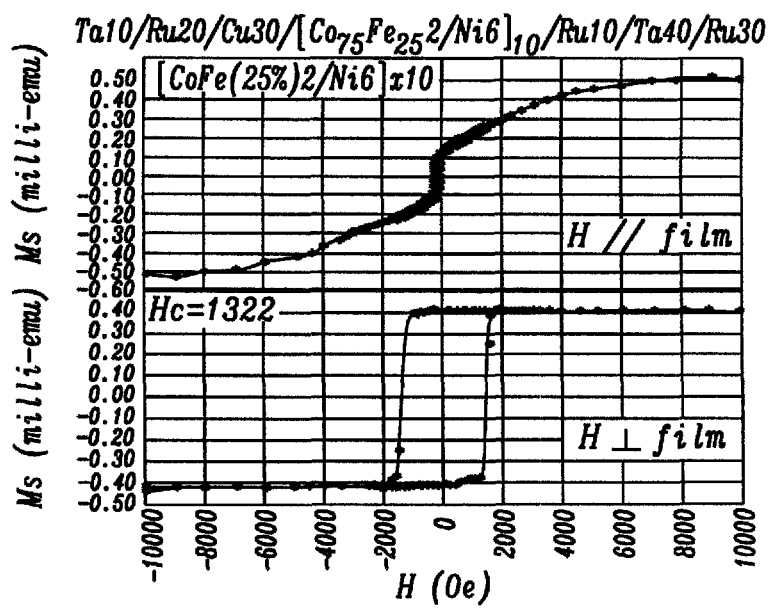
FIG. 4 depicts MH curves for a $(Co_{75}Fe_{25}2/Ni6)_{10}$ laminated SIL with PMA according to an embodiment of the present invention.
Figure 5:
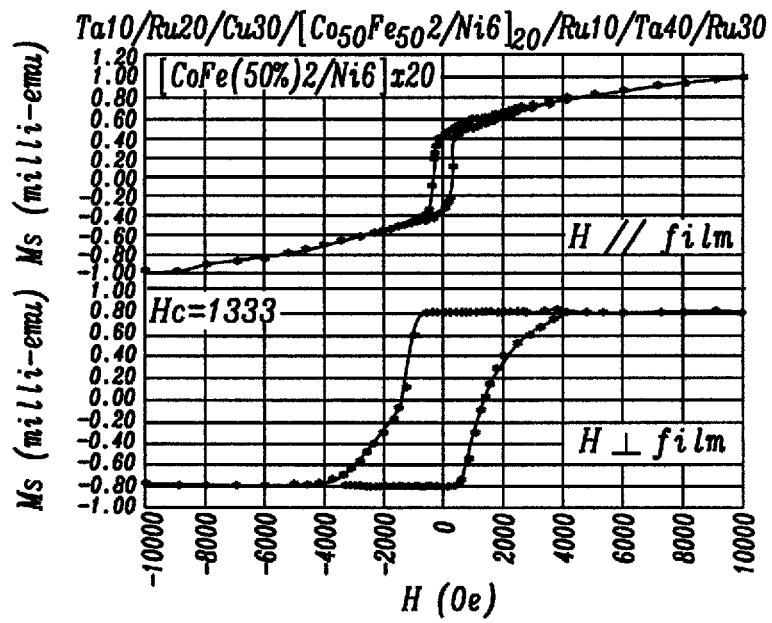
FIG. 5 shows MH curves for a $(Co_{50}Fe_{50}2/Ni6)_{20}$ laminated SIL with PMA according to an embodiment of the present invention.
Figure 6:
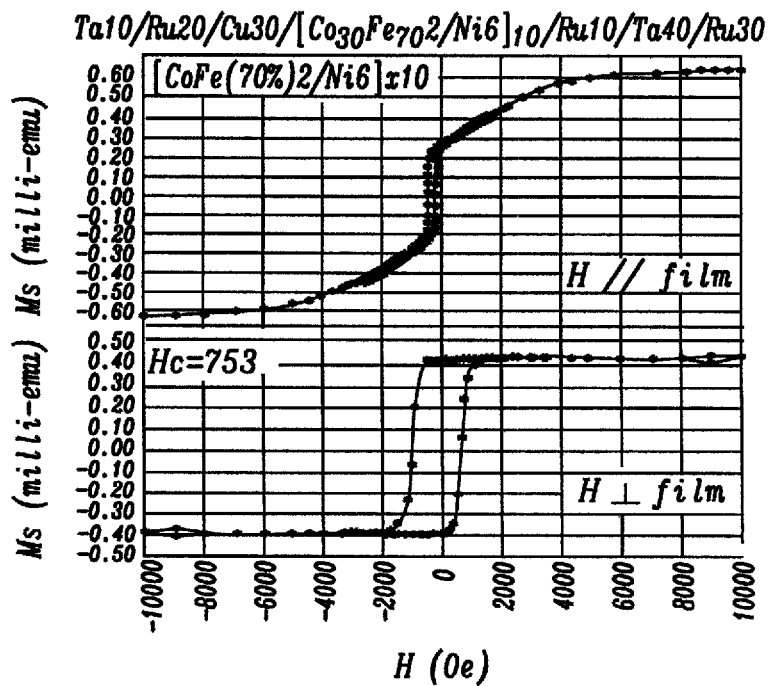
FIG. 6 shows MH curves for a $(Co_{30}Fe_{70}2/Ni6)_{10}$ laminated SIL with PMA according to an embodiment of the present invention.

The present invention is a CPP spin valve structure that includes a $(CoFe/Ni)_X$ laminated reference layer (SIL) with perpendicular magnetic anisotropy that is fully established with a thin composite seed layer comprised of a lower Ta layer and an upper metal layer with fcc(111) or hcp(001) crystal orientation for enhanced performance in spin transfer oscillators including MAMR devices, STT-MRAM devices, and in other spintronic devices. The free layer or FGL may have a FeCo or $(CoFe/Ni)_Y$/FeCo configuration to enable easier FGL oscillations. The present invention also includes a method of depositing a $(CoFe/Ni)_X$ or $(CoFe/Ni)_Y$ laminated layer or the like such that the CoFe/Ni interfaces are well preserved and only a thin seed layer is required for establishing the desired fcc (111) orientation. The terms "field" and "flux" may be used interchangeably when describing FGL components of a MAMR device.

In related U.S. Pat. No. 8,064,244, we disclosed the advantages of Co/Ni multilayer structures having PMA in MRAM applications where the magnetic anisotropy of a $(Co/Ni)_X$ laminated structure arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. Since Fe, Co, and Ni atoms have very similar outer electron configurations, i.e. Fe has $[Ar]3d^64s^2$ which is one electron different from Co $[Ar]3d^74s^2$ which has one electron less than Ni $[Ar]3d^84s^2$, in principle, with some thickness and process optimizations, there should be a possibility of PMA behavior in CoFe/Ni laminated structures. In fact, in related U.S. Pat. No. 8,184,411, we described the advantages of forming CoFe/Ni laminates having high PMA as a free layer or reference layer in a spintronic device.

Referring to FIGS. 2-6, MH curves are illustrated for $[Co_{(100-z)}Fe_z]/Ni$ laminates where z varies from 0 to 70 atomic % to demonstrate the magnitude (Hc) of the perpendicular (PMA) component in the films. Note that the distance in the x-axis direction between the vertical portions of the curves in the lower half of each graph is related to Hc. MH curves were obtained using a vibrating sample magnetometer (VSM). The upper plot in each figure shows the horizontal to plane component of each magnetic field and the lower plot in each figure illustrates the perpendicular magnetic anisotropy (PMA) component.

In the present invention, we disclose additional spin valve structures wherein CoFe/Ni laminates or the like may be exchange coupled with high magnetic moment materials such as FeCo to provide a more robust spin injection layer and enable easier oscillations in field generation layers in MAMR or related spintronic devices. The new structures are based on our findings that once the number of laminations (x) in a $(CoFe/Ni)_X$ structure reaches a large enough number between about 5 and 50, there is a sufficient quantity of CoFe and Ni valence electrons to generate a high PMA for spintronics applications from the spin-orbit interactions. Furthermore, a high PMA layer is able to exchange couple with an adjacent magnetic layer such as FeCo to impart a certain amount of PMA character in a FeCo layer, for example. In one aspect, a composite seed layer represented by Ta/M1 where M1 is an upper metal layer having a fcc(111) or hcp(001) crystal orientation such as Ru, Cu, or Au, or an alloy such as NiCr provides an additional advantage of enhancing the (111) texture in overlying spin valve structures thereby optimizing the PMA in the laminated SIL and field generation layer.

Figure 7A:
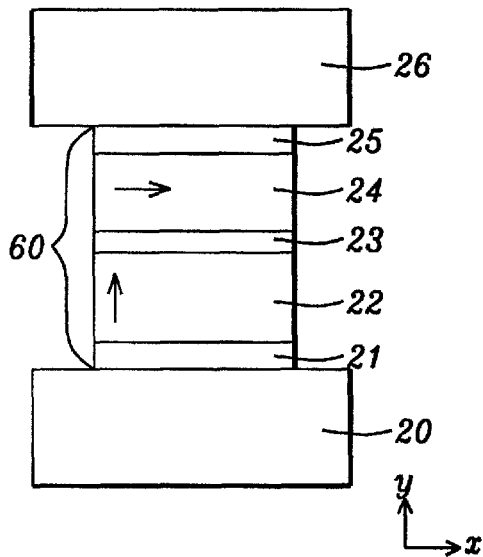
FIG. 7a shows a MAMR structure with a bottom SIL configuration where the FGL has a horizontal anisotropy and the SIL has PMA.

Referring to FIG. 7a, a cross-sectional view of a bottom SIL configuration in a MAMR device according to one embodiment of the present invention is shown. Substrate 20 may be a main pole layer comprised of CoFe, NiFe, or CoFeNi, for example. The spin valve stack of layers 21-25 formed on the substrate is hereafter referred to as a spin transfer oscillator (STO) 60. There is a composite seed layer 21 with a fcc(111) lattice formed on the substrate and comprised of a Ta/Ru/Cu configuration where a lower Ta layer having a thickness of 5 to 100 Angstroms contacts the substrate 20, a middle Ru layer about 10 to 100 Angstroms thick is formed on the Ta layer, and an upper Cu layer 1 to 100 Angstroms thick is formed on the Ru layer. In another aspect, the upper Cu layer may be removed and a Ta/Ru composite seed layer 21 is employed wherein the Ta and Ru layers have thicknesses of 5 to 100 Angstroms, and 10 to 100 Angstroms, respectively. Optionally, Ru may be replaced by a metal M1 layer having a fcc(111) or hcp(001) lattice structure. For example, the composite seed layer 21 may have a Ta/Cu or Ta/NiCr configuration where Ta thickness is from 5 to 50 Angstroms, Cu thickness is between 20 and 50 Angstroms, and NiCr thickness is from 40 to 100 Angstroms.

In another embodiment, the upper Cu layer in the trilayer seed layer 21 configuration may be replaced by a metal M2 such as Ti, Pd, W, Rh, Au, Ag, or the like with a thickness for M2 of from 1 to 100 Angstroms to give a Ta/M1/M2 configuration where M1 is unequal to M2. However, it is critical that the composite seed layer 21 be comprised of a lower Ta layer and at least one metal layer having fcc(111) or hcp(001) crystal orientation on the Ta layer to enhance the (111) crystal structure in other layers in the spin valve thereby enlarging the PMA magnitude in an overlying $(CoFe/Ni)_X$ laminated SIL 22. In another embodiment, the composite seed layer may comprise NiCr and at least one of Ta and Ru.

Above the composite seed layer 21 is a reference layer or SIL 22 that has a $(A1/A2)_X$ structure where x is between 5 and 50 depending on the Mst requirement. Each of the plurality of magnetic A1 layers in the A1/A2 laminate has a thickness from 0.5 to 5 Angstroms, and preferably between 1.5 to 3 Angstroms. Each of the plurality of magnetic A2 layers in the SIL has a thickness from 2 to 10 Angstroms, and preferably between 3.5 and 8 Angstroms. Preferably, the thickness t2 of an A2 layer is greater than an A1 layer thickness t1, and more preferably, t2~2×t1 in order to optimize the spin orbit interactions between adjacent A1 and A2 layers. In addition, A1 and A2 layers are deposited by a method that preserves the A1/A2 interfaces as described in a later section. In one aspect, when t1 is less than or equal to about 2 Angstroms, the A1 layer may be considered as a "close-packed" layer and not necessarily having a (111) crystal orientation. In one embodiment, the A1 layer is comprised of CoFe and the A2 layer is Ni, and each of the CoFe layers in the $(CoFe/Ni)_X$ laminate has a $[Co_{(100-z)}Fe_z]$ composition in which z is from 0 to 90 atomic %.

In an alternative embodiment, the $(CoFe/Ni)_X$ laminate in SIL 22 may be replaced by one of $[Co(t1)/NiFe(t2)]_X$, $[Co(t1)/NiCo(t2)]_X$, $[CoFe(t1)/NiFe(t2)]_X$ or $[CoFe(t1)/NiCo(t2)]_X$ wherein the Ni content in the NiFe and NiCo layers ranges from 50 to 100 atomic %.

The present invention also encompasses an embodiment wherein the laminated SIL 22 is comprised of $[CoFeR(t1)/Ni(t2)]_X$, $[CoFeR(t1)/NiFe(t2)]_X$, or $[CoFeR(t1)/NiCo(t2)]_X$ where R is a metal such as Ru, Rh, Pd, Ti, Zr, Hf, Ni, Cr, Mg, Mn, or Cu. Preferably, the R content in the CoFeR alloy is less than 10 atomic % and a CoFeR layer has a t1 thickness.

Above the SIL 22 is a non-magnetic spacer 23 that may be comprised of Cu in a CPP-GMR configuration, or a dielectric layer such as AlOx, MgO, TiOx, TiAlOx, MgZnOx, ZnOx, or other metal oxides or metal nitrides typically employed as insulator layers to give a CPP-TMR configuration. MgO is especially preferred as a non-magnetic spacer in a CPP-TMR configuration because a higher MR ratio is achieved than with other metal oxides. The metal oxide may be formed by first depositing the metal preferably by a sputter deposition method and then performing a radical oxidation (ROX) or natural oxidation (NOX) process. A second metal layer may be deposited on the resulting oxidized metal layer to complete the non-magnetic spacer process. A Cu spacer 23 may have a thickness from 15 to 150 Angstroms, and preferably between 20 to 60 Angstroms. Preferably, the metallic spacer 23 is sufficiently thick to prevent coupling between the SIL 22 and FGL 24. Moreover, a Cu spacer is selected because of having excellent conductivity to enable a current to pass through the STO layers 21-25 in a current perpendicular to plane (CPP) direction during a read or write process.

FGL 24 is formed on the non-magnetic spacer 23 and preferably has a high spin polarization and a small magnetic damping coefficient in order to enable spin transfer magnetization switching in the spintronic device. FGL is a magnetic (ferromagnetic) layer made of FeCo or an alloy thereof containing at least one atom selected from Al, Ge, Si, Ga, B, C, Se, and Sn and has a large magnetic moment (high Bs) aligned along an easy axis direction that is switched to an opposite direction when a spin torque of sufficient magnitude is applied. In a preferred embodiment, FGL 24 is a FeCo layer with a Fe content ≥50 atomic % and a thickness from 50 to 300 Angstroms. However, the FGL may also be a CoFe layer in which Fe content is <50 atomic %.

The uppermost layer in STO 60 is a composite capping layer 25 that contacts a write shield 26 according to one embodiment of the present invention. In one aspect, the capping layer 25 has a Ru/Ta/Ru configuration where the upper Ru layer is used to provide oxidation resistance and serves as an excellent electrical contact. A substantial reduction in critical current density (Jc) occurs when a thin Ru layer is employed as a capping layer in a STT-MRAM embodiment due to the strong spin scattering effect of Ru. Critical current density (Jc) is preferably about $10^6$ A/cm$^2$ to be viable for spin-transfer magnetization switching in the 90 nm technology node and beyond. Higher values could destroy a thin tunnel barrier made of AlOx, MgO, or the like as employed in a CPP-TMR embodiment of the present invention. The Ta layer may be included to offer etch resistance in subsequent processing steps. Optionally, other capping layer materials used in the art may be employed as capping layer 25.

It should be understood that to achieve a desirable MAMR device, a large Hac must be generated by the FGL which means a high Bs in the FGL material is required since Hac increases as Bs becomes larger. However, once the Bs becomes too large, the critical current density is too large and will raise a serious reliability concern. According to Slonczewski's model in the reference cited earlier, once the FGL has PMA or partial PMA, the critical current density for spin transfer could be greatly reduced. Therefore, we were motivated as described hereinafter to employ PMA in a CoFe/Ni laminate, for example, to induce partial PMA in a high Bs FGL such as FeCo through exchange coupling. In theory, a composite FGL having a laminate with high PMA and a high Bs material should result in a high moment and partial PMA to greatly assist FGL oscillations and increase Hac.

Figure 8A:
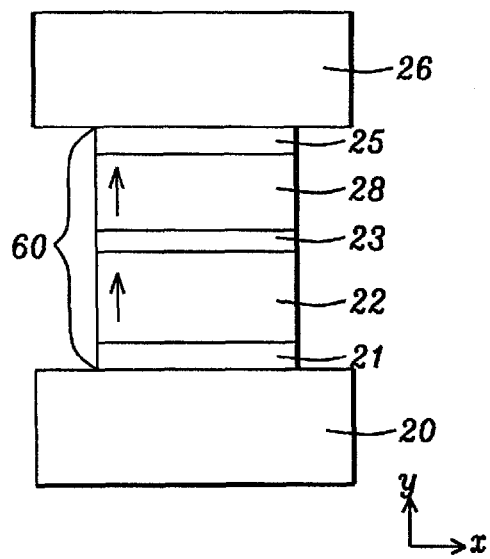
FIG. 8a shows a MAMR structure with a top SIL configuration where the FGL has a horizontal anisotropy and the SIL has PMA.

Referring to FIG. 8a, the STO structure in FIG. 7a is modified to include a laminate in the field generation layer to give a preferred embodiment with a FGL 28 having an (A1/A2)$_Y$/FeCo or [CoFe(t1)/Ni(t2)]$_Y$/FeCo configuration where y is between 5 and 30. Furthermore, one or both of the (A1/A2)$_X$ and (A1/A2)$_Y$ laminates in the resulting seed/SIL/spacer/FGL/capping layer configuration may be replaced by a laminate where (A1/A2) is one of [Co(t1)/NiFe(t2)], [Co(t1)/NiCo(t2)], [CoFe(t1)/NiFe(t2)], [CoFe(t1)/NiCo(t2)], [CoFeR(t1)/Ni(t2)]$_X$, [CoFeR(t1)/NiFe(t2)], or [CoFeR(t1)/NiCo(t2)]. Alternatively, the FeCo high Bs layer with a thickness of 50 to 300 Angstroms in the composite FGL may be replaced by a FeCo alloy with an atom selected from Al, Ge, Si, Ga, B, C, Se, and Sn, or by a CoFe alloy where Fe content is <50 atomic %.

Figure 7B:
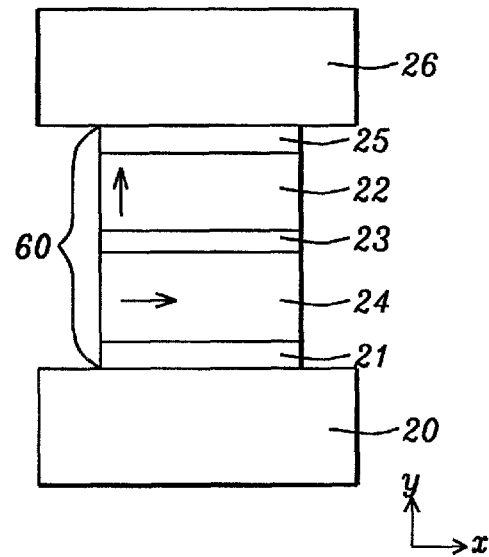
FIG. 7b depicts a MAMR structure according to bottom SIL embodiment of the present invention where both of the SIL and FGL have PMA.

Referring to FIG. 7b, a top SIL embodiment of the present invention is depicted which comprises the same layers as in FIG. 7a except the SIL 22 and FGL 24 have switched positions such that the STO 60 formed on the substrate 20 is represented by seed layer/FGL/non-magnetic spacer/SIL/capping layer where the seed layer contacts the substrate and the capping layer is the uppermost layer. For a CPP-GMR embodiment, STO 60 may have a Ta/Ru/Cu/FeCo/Cu/[CoFe(t1)/Ni(t2)]$_Y$/Ru/Ta/Ru configuration. Alternatively, the Ta/Ru/Cu seed layer, FeCo FGL, CoFe/Ni laminate (SIL), and capping layer may be replaced by other suitable materials as indicated previously for the bottom SIL embodiments. Moreover, the Cu spacer may be replaced by a dielectric layer such as AlOx, MgO, TiOx, TiAlOx, MgZnOx, ZnOx, or other metal oxides or metal nitrides employed as insulator layers to give a CPP-TMR configuration. In one aspect, the substrate 20 may be a main pole layer which functions as a bottom electrode and a write shield 26 may be formed on the capping layer to serve as a top electrode in the spintronic device.

Figure 8B:
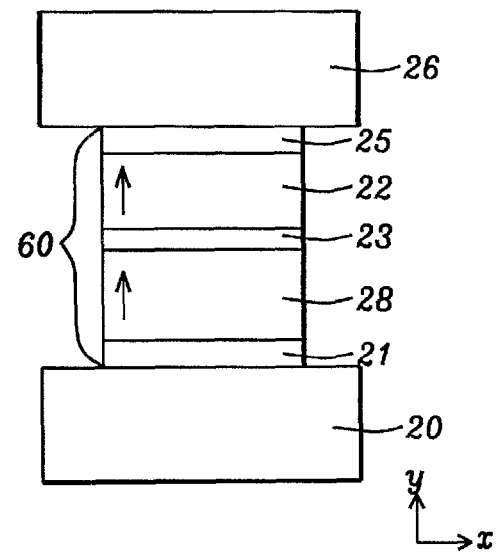
FIG. 8b depicts a MAMR structure according to top SIL embodiment of the present invention where both of the SIL and FGL have PMA.

Referring to FIG. 8b, the top SIL embodiment in FIG. 7b is modified to include a laminate in the field generation layer to give a (A1/A2)$_Y$ or [CoFe(t1)/Ni(t2)]$_Y$/FeCo FGL configuration where y is between 5 and 30. Furthermore, one or both of the (A1/A2)$_X$ and (A1/A2)$_Y$ laminates in the resulting seed/FGL/spacer/SIL/capping layer STO 60 may be replaced by a laminate where (A1/A2) is one of [Co(t1)/NiFe(t2)], [Co(t1)/NiCo(t2)], [CoFe(t1)/NiFe(t2)], [CoFe(t1)/NiCo(t2)], [CoFeR(t1)/Ni(t2)]$_X$, [CoFeR(t1)/NiFe(t2)], or [CoFeR(t1)/NiCo(t2)]. Alternatively, the FeCo high Bs layer in the composite FGL may be replaced by a FeCo alloy containing at least one atom selected from Al, Ge, Si, Ga, B, C, Se, and Sn, or by a CoFe alloy in which Fe content is <50 atomic %.

In yet another embodiment, both of the SIL 22 and FGL 28 may be comprised of a composite including a FeCo or alloy layer with a high Bs, and an (CoFe/Ni) laminate or the like that exchange couples with the high Bs layer to give an (A1/A2)$_X$/FeCo or (A1/A2)$_Y$/FeCo configuration, respectively, to generate partial PMA in the FeCo or alloy layer. For instance, the STO 60 on substrate 20 may have a CPP-GMR configuration represented by Ta/Ru/Cu/[CoFe(t1)/Ni(t2)]$_X$/FeCo/Cu/[CoFe(t1)/Ni(t2)]$_Y$/FeCo/Ru/Ta/Ru or Ta/Ru/Cu/[CoFe(t1)/Ni(t2)]$_Y$/FeCo/Cu/[CoFe(t1)/Ni(t2)]$_X$/FeCo/Ru/Ta/Ru. In this case, the FeCo layer coupled with the SIL preferably has a thickness of about 50 to 100 Angstroms and less than that of the SIL. As indicated earlier, a dielectric layer such as AlOx, MgO, TiOx, TiAlOx, MgZnOx, ZnOx, or other metal oxides or metal nitrides employed as insulator layers may be used instead of a Cu spacer to provide a CPP-TMR configuration. Furthermore, the Ta/Ru/Cu seed layer, one or both of the FeCo layers in the FGL and SIL, one or both of the CoFe/Ni laminates, and the capping layer may be replaced by another suitable material as described previously.

Figure 9:
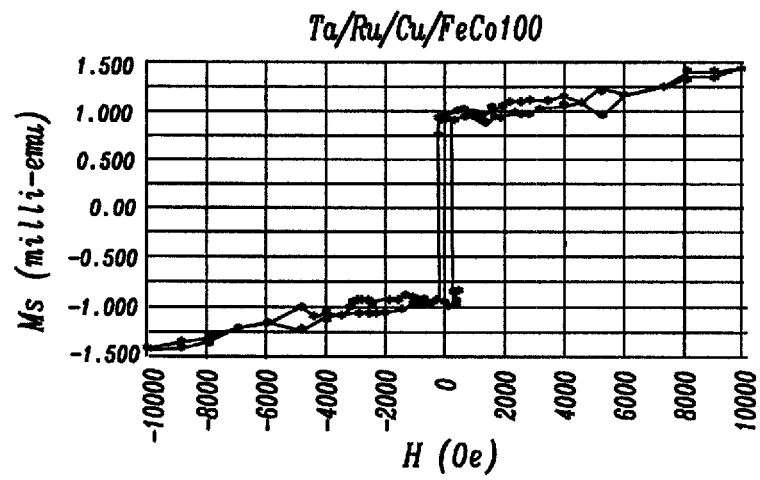
FIG. 9 is an MH curve (perpendicular component) of a reference structure including a Ta/Ru/Cu seed layer and an overlying FeCo100 FGL layer showing no PMA.

Referring to FIG. 9, a MH curve is illustrated for a reference structure including a 100 Angstrom thick FeCo layer grown on a Ta10/Ru20/Cu20 seed layer. The results show no PMA established in the FeCo layer as expected from a magnetic material that typically has a magnetic moment aligned longitudinally along an easy axis direction parallel to the planes of the layers in a spin valve stack.

Figure 10:
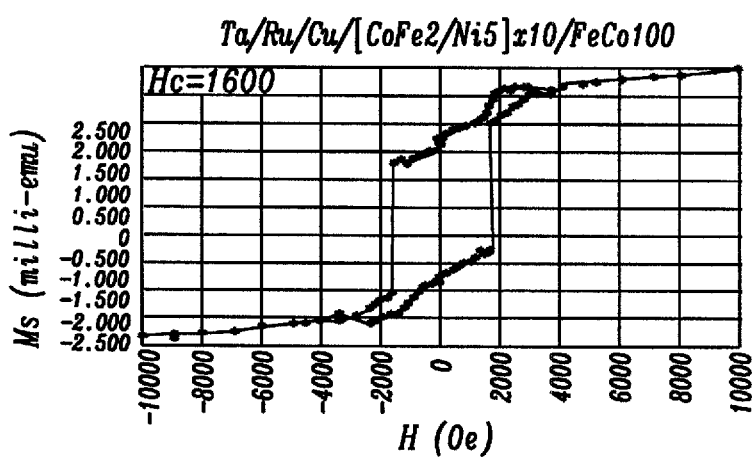
FIG. 10 is a MH curve showing PMA in an exchanged coupled $(CoFe/Ni)_{15}$/FeCo FGL layer formed on a Ta/Ru/Cu seed according to an embodiment of the present invention.

On the other hand, when a composite (CoFe2/Ni5)$_{10}$/FeCo100 FGL is formed on the Ta10/Ru20/Cu20 seed layer according to an embodiment of the present invention, the resulting MH curve in FIG. 10 shows that a substantial PMA of around 1600 Oe is generated by exchange coupling between the (CoFe/Ni)$_Y$ laminate and the FeCo high Bs layer. In both FIG. 9 and FIG. 10, Fe content in the FeCo100 layer is 70 atomic % and annealing was performed at 220° C. for 2 hours. The other (A1/A2)$_Y$ laminates described herein are expected to give similar PMA behavior in a composite [(A1/A2)$_Y$/FeCo100] FGL.

The present invention also anticipates that in a CPP-GMR configuration having either a bottom SIL or top SIL structure, the Cu spacer may be replaced by a confining current path (CCP) CPP GMR sensor where the current through the Cu spacer is limited by the means of segregating metal path and oxide formation. With a CCP-CPP scheme, the Cu metal path is limited through an insulator template or nano-oxide layer (NOL) so that the MR ratio can be significantly enhanced. An NOL layer (not shown) may be formed by a well known method involving deposition of an AlCu layer on a lower Cu layer followed by a pre-ion treatment (PIT) and an ion-assisted oxidation (IAO) process to convert the AlCu layer into an AlOx matrix having segregated Cu pathways (current confining paths) therein. Thereafter, an upper Cu layer is deposited on the NOL (CCP) layer.

In all STO embodiments described herein, a key feature is that the composite seed layer 21 having a Ta/M1 or Ta/M1/M2 configuration enhances the (111) lattice structure and PMA in laminated SIL 22 in a bottom SIL configuration, or in a laminated FGL 28 in a bottom FGL configuration. Moreover, laminated SIL 22 and laminated FGL 28 are deposited in a manner that preserves the CoFe/Ni (A1/A2)$_X$ or (A1/A2)$_Y$ interfaces formed therein.

Figure 11:
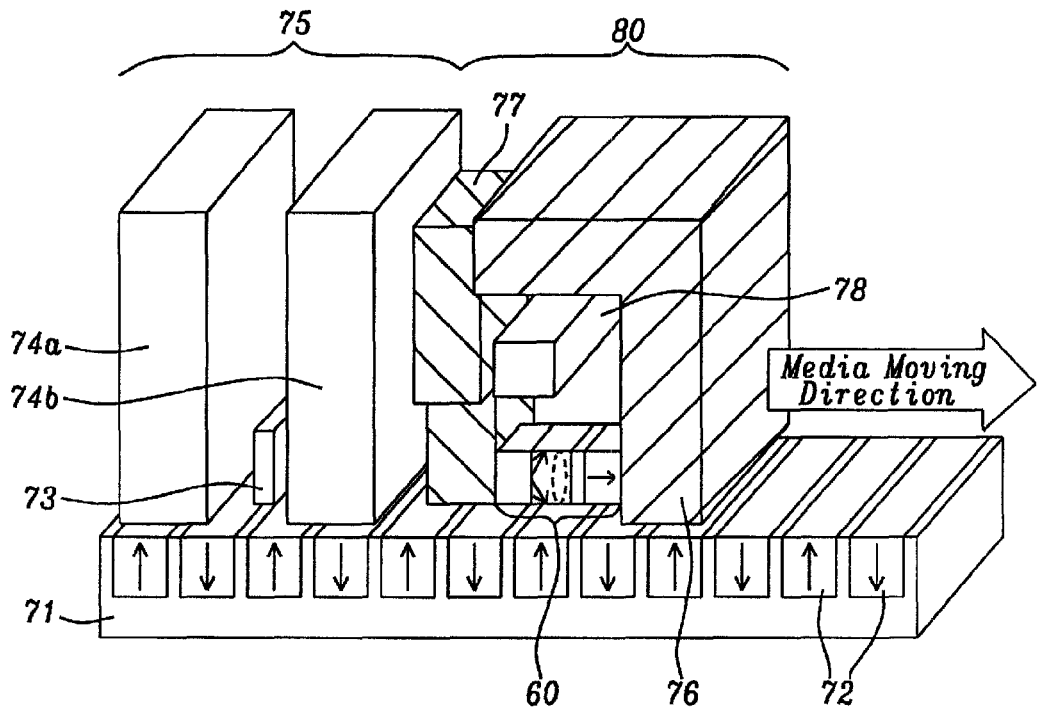
FIG. 11 is a cross-sectional view of a merged read-write head wherein a "top" STO writer comprised of a main pole, write shield, and spin transfer oscillator structure is formed according to an embodiment of the present invention.

Referring to FIG. 11, the MAMR structure or spin transfer oscillator (STO) 60 may be formed in a write head 80. In the exemplary embodiment, the STO writer 80 is pictured as part of a merged read-write head where the read head 75 includes top and bottom shields 74a, 74b, and a sensor 73 between the aforementioned shields. STO writer 80 is comprised of a main pole 76, a trailing shield 77 and a wire 78 for injecting current into the spin transfer oscillator structure 60 which is shown in a "top FGL/bottom SIL" STO configuration. As mentioned earlier, a bottom SIL configuration preferably has a (CoFe/Ni)$_X$ laminate or the like exchanged coupled with a high Bs layer such as FeCo and the SIL 22 is separated from the main pole layer 76 by a seed layer. The (CoFe/Ni)$_X$ laminate has a PMA aligned in the same direction as the media moving direction. Note that the FGL or oscillator layer is formed closer to the first electrode (trailing shield 77) than the SIL or reference layer and has a magnetization direction which is free to rotate as indicated by the layer with two arrows and a dotted circle in STO 60.

Figure 12:
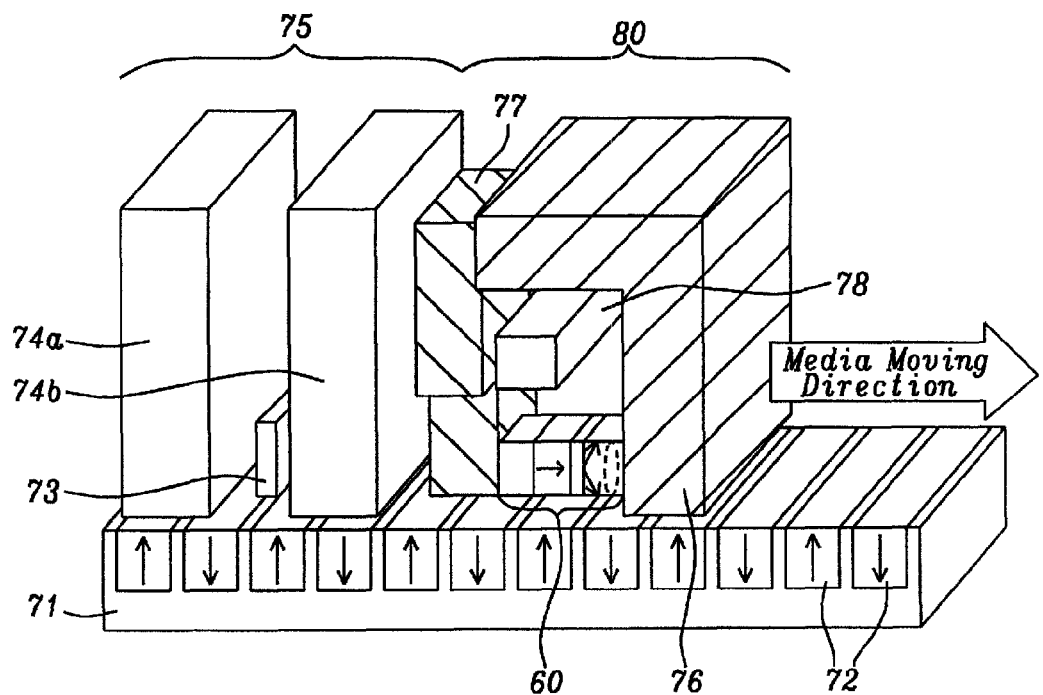
FIG. 12 is a cross-sectional view of a merged read-write head wherein a "bottom" STO writer comprised of a main pole, write shield, and spin transfer oscillator structure is formed according to an embodiment of the present invention.

In an alternative embodiment as depicted in FIG. 12, the positions of the field generation (oscillator) layer and SIL may be switched to give a "bottom FGL/top SIL" STO 60 configuration. In this case, the FGL is separated from the main pole 76 by a seed layer and a capping layer separates the SIL from the trailing shield 77. The merged read-write head moves in the direction indicated while suspended on an air bearing surface above substrate 71 having media tracks 72 formed thereon.

With regard to a process of forming the various spin valve structures of the aforementioned embodiments, all of the layers in the CPP spin valve stack may be laid down in a sputter deposition system. For instance, the CPP stack of layers may be formed in an Anelva C-71.00 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

The present invention also encompasses an annealing step after all layers in the CPP spin valve structure have been deposited. The STO 60 may be annealed by applying a temperature between 150° C. and 300° C., and preferably between 180° C. and 250° C. for a period of 0.5 to 5 hours. No applied magnetic field is necessary during the annealing step because PMA is established due to the (111) texture in the composite seed layer 21 and due to the CoFe—Ni spin orbital interactions in the laminated SIL 22, and in laminated FGL 28. However, the present invention also anticipates that a field may be applied during annealing to further increase PMA in the spin valve (STO) structure.

An important feature of the present invention is the method for depositing a $(A1/A2)_X$ laminated SIL 22 and a laminated $(A1/A2)_Y$ FGL 28. It should be understood that the same deposition process applies to other laminates described herein such as $(Co/NiFe)_X$, $(Co/NiCo)_X$, $(CoFe/NiFe)_X$ or $(CoFe/NiCo)_X$, $(CoFeR/Ni)_X$, $(CoFeR/NiFe)_X$, and $(CoFeR/NiCo)_X$. In particular, a lower RF power and high Ar pressure are utilized to avoid damaging the substrate on which each CoFe or Ni layer is deposited in order to preserve the resulting CoFe/Ni interfaces and enhance the PMA property therein. In other words, the ion energy impinging on recently deposited CoFe and Ni surfaces is minimized during sputter deposition of subsequent CoFe and Ni layers to reduce damage from ion bombardment during the sputtering process. In one embodiment, each of the A1 and A2 layers in a laminated layer 22, 28 is laid down in a DC magnetron sputter deposition chamber by a process comprising a RF power of less than 200 Watts, and an Ar flow rate of >15 standard cubic centimeters per minute (sccm). Deposition of each A1 and A2 layer requires less than a minute and total time necessary to form a $(A1/A2)_{20}$ structure is less than about an hour.

Once all the layers in the STO 60 are formed, the STO is patterned into a rectangular, oval, circular, or other shapes from a top-down perspective along the media moving direction by a well known photoresist patterning and reactive ion etch transfer sequence. Thereafter, an insulation layer (not shown) may be deposited on the substrate 20 followed by a planarization step to make the insulation layer coplanar with the capping layer 25. Next, the trailing shield 77 may be formed on the STO 60 and insulation layer as appreciated by those skilled in the art.

Example 1

A series of STO structures comprising a bottom SIL configuration was fabricated to provide examples of the first embodiment. The bottom SIL configuration is represented by Ta10/Ru20/Cu20/[Co$_{(100-Z)}$Fe$_Z$2/Ni5]$_X$/spacer/FeCo100/Ru10/Ta40/Ru30 where the number following each layer is the thickness in Angstroms. Ta/Ru/Cu is employed as the seed layer, FeCo100 is the FGL, and a (CoFe2/Ni5)$_X$ laminate is the SIL in which each CoFe layer is 2 Angstroms thick and each Ni layer is 5 Angstroms thick and x is maintained between 5 and 50. Fe content in the CoFe laminated layers is kept between 0 and 90 atomic %. A Cu or another metallic spacer is employed for CPP-GMR applications while a AlOx, MgO, TiOx, TiAlOx, MgZnOx, or ZnOx spacer is used for CPP-TMR structures. The capping layer is a Ru10/Ta40/Ru30 composite. Based on torque measurements, we deduced that Hk for each (CoFe/Ni)$_X$ stack is >15000 Oersted (Oe).

Example 2

A preferred bottom SIL configuration was fabricated and is represented by Ta10/Ru20/Cu20/[Co$_{(100-Z)}$Fe$_Z$2/Ni5]$_X$/spacer/[Co$_{(100-Z)}$Fe$_Z$2/Ni5]$_Y$/FeCo100/Ru10/Ta40/Ru30. This structure is a modification of the first embodiment where a (CoFe/Ni)$_Y$ laminate is inserted between the non-metallic spacer and the FeCo100 layer to give a composite FGL where y is between 5 and 30. Since the [Co$_{(100-Z)}$Fe$_Z$2/Ni5]$_Y$ laminate has a strong magnetic coupling with the FeCo100 layer, the large PMA of the [Co$_{(100-Z)}$Fe$_Z$2/Ni5]$_Y$ laminate will force the anisotropy of the FeCo to tilt partially toward the perpendicular to plane direction so that the entire FGL can easily oscillate under a low current density.

Example 3

A series of STO structures comprising a top SIL configuration was fabricated according to another embodiment of the present invention. The top SIL configuration is represented by Ta10/Ru20/Cu20/FeCo100/spacer/[Co$_{(100-Z)}$Fe$_Z$2/Ni5]$_X$/Ru10/Ta40/Ru30 where the number following each layer is the thickness in Angstroms. Ta/Ru/Cu is employed as the seed layer, FeCo100 is the FGL, and a (CoFe2/Ni5)$_X$ laminate is the SIL in which each CoFe layer is 2 Angstroms thick and each Ni layer is 5 Angstroms thick and x is maintained between 5 and 50. Fe content in the CoFe laminated layers is kept between 0 and 90 atomic %. Cu or another metallic spacer is employed for CPP-GMR embodiments while a AlOx, MgO, TiOx, TiAlOx, MgZnOx, or ZnOx spacer is used for CPP-TMR structures. The capping layer is a Ru10/Ta40/Ru30 composite. Based on torque measurements, we deduced that Hk for each (CoFe/Ni)$_X$ stack is >15000 Oersted (Oe).

Example 4

A preferred top SIL configuration was fabricated and is represented by Ta10/Ru20/Cu20/[Co$_{(100-Z)}$Fe$_Z$2/Ni5]$_Y$/FeCo100/spacer/[Co$_{(100-Z)}$Fe$_Z$2/Ni5]$_X$/Ru 10/Ta40/Ru30. This structure is a modification of the top SIL embodiment in Example 3 where a (CoFe/Ni)$_Y$ laminate is inserted between the seed layer and the FeCo100 layer to give a composite FGL where y is between 5 and 30. Since the [Co$_{(100-Z)}$Fe$_Z$2/Ni5]$_Y$ laminate has a strong magnetic coupling with the FeCo100 layer, the large PMA of the [Co$_{(100-Z)}$Fe$_Z$2/Ni5]$_Y$ laminate will force the anisotropy of the FeCo to tilt partially toward the perpendicular to plane direction so that the entire FGL can easily oscillate under a low current density.

Example 5

According to another preferred embodiment of the present invention, the top SIL configuration in Example 4 may be further modified to include a FeCo layer coupled with the [Co$_{(100-Z)}$Fe$_Z$2/Ni5]$_X$ SIL to yield a composite SIL and a structure represented by Ta10/Ru20/Cu20/[Co$_{(100-Z)}$Fe$_Z$2/Ni5]$_Y$/FeCo/spacer/[Co$_{(100-Z)}$Fe$_Z$2/Ni5]$_X$/FeCo/Ru10/Ta40/Ru30. In this example, the lower FeCo layer coupled to the laminated FGL has a thickness between 50 and 300 Angstroms while the upper FeCo layer coupled to the SIL has a thickness between 50 and 100 Angstroms. The composite SIL configuration is employed to strengthen SIL robustness (stability) and the composite FGL is used as described previously to assist the FeCo FGL oscillations. In other words, exchange coupling between a high Bs layer such as FeCo and a PMA laminate like (FeCo/Ni)$_X$ or the like may be advantageously used to maintain the magnetization direction of the SIL as a reference layer in a STO device. The spacer may be Cu or a metal oxide as indicated in previous examples.

We have described various embodiments of bottom SIL and top SIL configurations in a STO device wherein magnetic coupling between a laminate with high PMA and a high Bs layer is employed to partially tilt the anisotropy of the high Bs layer toward a perpendicular to plane direction thereby enabling an easier FGL oscillation under low current density and produce a larger oscillating field (Hac) for better performance. In addition, a composite SIL involving magnetic coupling between a laminate with large PMA and a high Bs layer can be used to strengthen the robustness of the spin injection layer for improved performance. A high PMA in the laminates is achieved by a deposition method for CoFe and Ni films that preserves the CoFe/Ni interfaces and thereby maintains PMA therein to provide improved performance even with a thin seed layer.

While this invention has been particularly shown and described with reference to, the preferred embodiment thereof, it will be understood by those skilled in the art that various changes in form and details may be made without departing from the spirit and scope of this invention.

We claim:

1. A spin transfer oscillator (STO) structure in a spintronic device, comprising:
    (a) a composite seed layer comprising at least a lower Ta layer formed on a substrate and a metal (M1) layer having a fcc(111) or hcp(001) crystal structure contacting the lower Ta layer;
    (b) a field generation layer (FGL) that has an (A1/A2)$_Y$/FeCo alloy configuration where A1 is one of Co, CoFe, or CoFeR wherein R is one of Ru, Rh, Pd, Ti, Zr, Hf, Ni, Cr, Mg, Mn, or Cu, and A2 is one of Ni, NiCo, and NiFe, and Y is a number of laminations, the FeCo alloy includes one or more of Al, Ge, Si, Ga, C, Se, and Sn and contacts a bottom surface of a non-magnetic spacer;
    (c) the non-magnetic spacer;
    (d) a laminated spin injection layer (SIL) with high perpendicular magnetic anisotropy (PMA) and with a (A1/A2)$_X$ configuration contacting a top surface of the non-magnetic spacer wherein x is in a range from 5 to 50, and a thickness (t2) of each A2 magnetic layer is greater than a thickness (t1) of each A1 magnetic layer; and
    (e) a capping layer contacting a top surface of the SIL.

2. The STO structure of claim 1 wherein the Fe content in the FeCo alloy is less than 50 atomic %.

3. The STO structure of claim 1 wherein the (A1/A2)$_Y$ laminate contacts the seed layer.

4. The STO structure of claim 3 where Y is from about 5 to 30.

* * * * *